United States Patent
Gambino et al.

(10) Patent No.: US 8,829,626 B2
(45) Date of Patent: Sep. 9, 2014

(54) MEMS SWITCHES AND FABRICATION METHODS

(71) Applicant: International Buisness Machines Corporation, Armonk, NY (US)

(72) Inventors: Jeffrey P. Gambino, Westford, VT (US); Stephen A. Mongeon, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/017,646

(22) Filed: Sep. 4, 2013

(65) Prior Publication Data

US 2014/0209442 A1    Jul. 31, 2014

Related U.S. Application Data

(62) Division of application No. 12/961,047, filed on Dec. 6, 2010, now Pat. No. 8,609,450.

(51) Int. Cl.
*H01L 27/14* (2006.01)
*H01L 29/84* (2006.01)
*G01P 15/08* (2006.01)

(52) U.S. Cl.
USPC ............................ 257/414; 257/415; 257/417

(58) Field of Classification Search
USPC ................................................ 257/415, 417
See application file for complete search history.

(56) References Cited

U.S. PATENT DOCUMENTS

| | | | |
|---|---|---|---|
| 5,578,976 A | 11/1996 | Yao | |
| 6,583,031 B2 | 6/2003 | Lin | |
| 6,625,047 B2 | 9/2003 | Coleman, Jr. | |
| 6,917,268 B2 | 7/2005 | Deligianni et al. | |
| 7,053,456 B2 | 5/2006 | Matsuo | |
| 7,083,737 B2 | 8/2006 | Lee et al. | |
| 7,265,429 B2 | 9/2007 | Wan | |
| 7,303,935 B2 | 12/2007 | DeNatale et al. | |
| 8,063,454 B2 * | 11/2011 | Sandhu et al. | 257/414 |
| 2005/0170656 A1 | 8/2005 | Nasiri et al. | |
| 2006/0023995 A1 | 2/2006 | Lee et al. | |
| 2006/0273871 A1 * | 12/2006 | Busta et al. | 335/78 |
| 2007/0128831 A1 | 6/2007 | Oka et al. | |
| 2009/0152980 A1 | 6/2009 | Huang | |
| 2009/0181487 A1 | 7/2009 | Mori et al. | |
| 2010/0038753 A1 | 2/2010 | Ni | |
| 2010/0213789 A1 | 8/2010 | Igarashi | |
| 2010/0263998 A1 | 10/2010 | Anderson et al. | |
| 2011/0079495 A1 | 4/2011 | Knipe et al. | |

OTHER PUBLICATIONS

USPTO, Notice of Allowance issued in U.S. Appl. No. 12/961,047 dated Aug. 14, 2013.

* cited by examiner

*Primary Examiner* — Angel Roman
(74) *Attorney, Agent, or Firm* — Wood, Herron & Evans LLP; Anthony J. Canale (57) ABSTRACT

MEMS switches and methods of fabricating MEMS switches. The switch has a vertically oriented deflection electrode having a conductive layer supported by a supporting layer, at least one drive electrode, and a stationary electrode. An actuation voltage applied to the drive electrode causes the deflection electrode to deflect laterally and contact the stationary electrode, which closes the switch. The deflection electrode is restored to a vertical position when the actuation voltage is removed, thereby opening the switch. The method of fabricating the MEMS switch includes depositing a conductive layer on mandrels to define vertical electrodes and then releasing the deflection electrode by removing the mandrel and layer end sections.

12 Claims, 8 Drawing Sheets

MEMS SWITCHES AND FABRICATION METHODS

CROSS-REFERENCE TO RELATED APPLICATIONS

This application is a divisional of application Ser. No. 12/961,047, filed Dec. 6, 2010, which is hereby incorporated by reference herein in its entirety.

BACKGROUND

The present invention relates generally to microelectromechanical systems (MEMS) structures and fabrication techniques and, more particularly, to microelectromechanical switches for integrated circuits and methods of fabricating microelectromechanical switches.

Components fabricated with the emerging technologies of microelectromechanical systems (MEMS) are being incorporated in an increasing number of consumer applications including, but not limited to, automotive electronics, medical equipment, cell phones, hard disk drives, computer peripherals, and wireless devices. MEMS technology is directed at forming miniaturized electro-mechanical devices and structures using micro-fabrication techniques. MEMS devices are characterized by some form of mechanical functionality, which is typically in the form of a least one moving structure. Structures may be formed on a suitable substrate by a series of processing steps involving thin film depositions that are photolithographically masked and etched. MEMS mechanical elements, sensors, and actuators may be integrated on a common substrate with complementary metal-oxide-semiconductor (CMOS) devices.

One type of MEMS based microelectronic device that has wide applicability to the electronics industry is the MEMS switch. MEMS switches rely on mechanical movement of a deflection electrode to make or break contact with a stationary electrode, thus forming a short circuit or an open circuit depending on the position of the deflection electrode. MEMS switches are typically actuated by using electrostatic forces to produce the mechanical movement required to change the state of the switch. MEMS switches are noted for their low power consumption, high isolation in the off state, low insertion loss in the on state, and high linearity, typically outperforming switches relying on semiconductor devices such as field-effect transistors (FETs). Switches provide an important building block in many electronic systems, and the performance characteristics of MEMS switches make them particularly attractive for providing signal switching functions in mixed signal, communications, and radio frequency integrated circuit applications.

Accordingly, there is a need for improved MEMS design structures and methods of fabricating those structures that provide for integration of MEMS switches with conventional integrated circuits.

SUMMARY

In one embodiment, a microelectromechanical (MEMS) switch may be formed on a supporting layer. The MEMS switch includes a stationary electrode, at least one drive electrode, and a deflection electrode. The deflection and stationary electrodes include a conductive layer having a vertical orientation relative to a top surface of the supporting layer. The deflection electrode is configured to be electrostatically attracted toward the at least one drive electrode, when the at least one drive electrode is electrically biased. In response to the electrostatic attraction, the deflection electrode experiences a cantilevered motion so that its conductive layer contacts the conductive layer of the stationary electrode.

In another embodiment, a MEMS switch may be fabricated by forming the conductive layer of the stationary electrode and the conductive layer of the deflection electrode so that the conductive layers have vertical orientation relative to a top surface of a supporting layer, and are separated from each other by a gap. At least one drive electrode is also formed so that when the at least one drive electrode is electrically biased, the deflection electrode is electrostatically attracted with a cantilevered motion toward the at least one drive electrode. The deflection electrode and at least one drive electrode are further configured so that a sufficient drive electrode bias causes the conductive layer of the deflection electrode to bridge the gap to contact the conductive layer of the stationary electrode.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
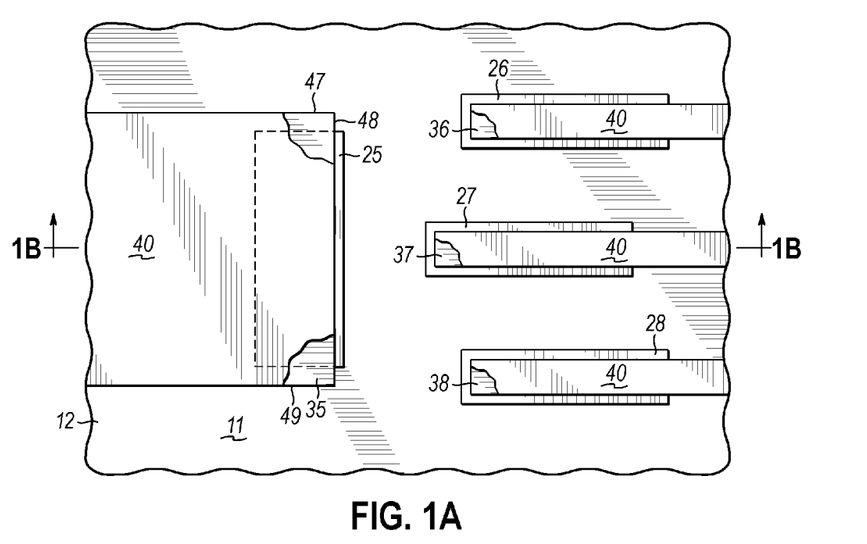
FIG. 1A is a diagrammatic top view of a portion of a substrate at an initial fabrication stage of a processing method in accordance with an embodiment of the invention.
Figure 1B:
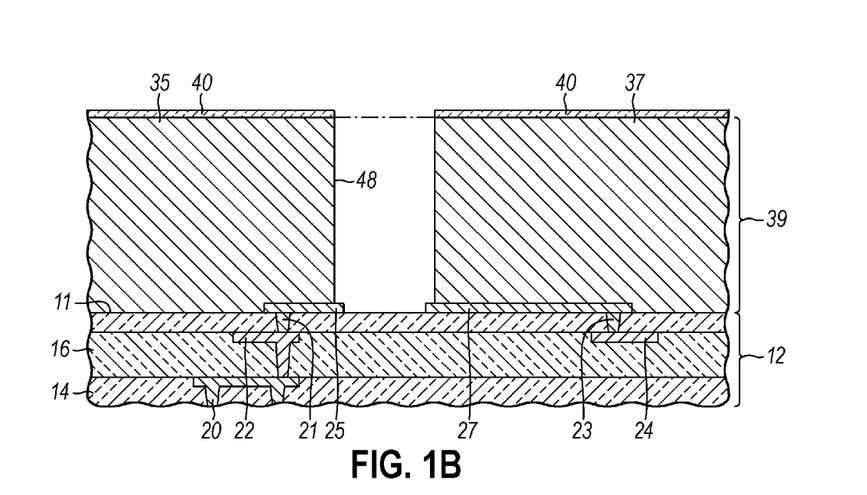
FIG. 1B is a cross-sectional view taken generally along line 1B-1B of FIG. 1A.

With reference to FIGS. 1A and 1B and in accordance with an embodiment of the invention, a top surface 11 of a supporting layer 12 is shown on which a vertical nano switch or MEMS switch 10 (FIGS. 4A, 4B) is to be fabricated. The supporting layer 12 may be comprised of silicon dioxide ($SiO_2$), borophosphosilicate glass (BPSG), phosphosilicate glass (PSG), silicon nitride ($Si_3N_4$), silicon oxynitride ($SiO_xN_y$), or any other suitable dielectric. The supporting layer 12 may be an interlevel or interlevel dielectric layer and may include embedded metallization formed as part of a back-end of the line (BEOL) process used to form single or multilevel interconnect structure for an underlying integrated circuit. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level, high density framework of conductive interconnections is formed. Damascene processes and materials used in damascene processes are understood by a person having ordinary skill in the art. The MEMS switch 10 is typically fabricated on the dielectric layer of a top or last level in the BEOL interconnect structure.

The BEOL interconnect structure may include one or more lower dielectric layers 14 containing metallization 20 that supplies local interconnect wiring, and one or more upper dielectric layers 16 containing metallization 22, 24 for higher levels of interconnect wiring. Surface contacts 25-28 may be formed by depositing a blanket layer of aluminum (Al), copper (Cu), alloys (e.g., $Al_xCu_y$) of primary metals, or other similar metals, using a conventional method of metal deposition, such as electroplating, evaporation, or sputtering; followed by a resist layer applied and photolithographically patterned in a conventional manner to mask the deposited metal where surface contacts 25-28 are to be formed. With the patterned resist layer operating as an etch mask that serves to protect underlying metal layer at the prospective locations of surface contacts 25-28, the metal blanket layer may be etched using Reactive Ion Etching (RIE), or any other suitable dry or wet etching process known to persons with ordinary skill in the art to form surface contacts 25-28. Surface contacts 25-28 may be positioned over via structures 21, 23 formed as part of a BEOL process so that the surface contacts 25-28 may be electrically coupled with the metallization 22, 24.

Signals and bias voltages may thereby be provided by the surface contacts 25-28 to the MEMS switch 10 from devices formed in the underlying integrated circuit (not shown), or from surface contact pads coupled to input/output (I/O) pins. Alternatively, surface contacts 25-28 may be electrically coupled to other devices and interconnect structures using surface interconnections, which may be formed as part of the surface contact 25-28 fabrication process. The switched signals may be, for example, radio frequency (RF) signals.

Mandrels 35-38 may then be formed by depositing a mandrel layer 39 on the top surface 11 of supporting layer 12. The mandrels 35-38 are comprised of a material that may be selectively etched with respect to the supporting layer 12, and may have a thickness in the range of 0.5 µm to 20 µm, such as a representative thickness of 2 µm thick. The mandrel layer 39 may be comprised of a high temperature organic polymer such as a polyimide, a polyarylene such a SiLK®, a benzocyclobutene (BCB) such as CYCLOTENE®, or other suitable polymer material. The high temperature polymer contained in the mandrel layer 39 preferably has a relatively high melting point for a polymer material.

A hard mask layer 40 is deposited on top of the mandrel layer 39 using conventional techniques known by persons having ordinary skill in the art. The hard mask layer 40 may be comprised of any suitable material, such as $SiO_2$, $Si_3N_4$, or $SiO_xN_y$, deposited using a conventional chemical vapor deposition (CVD) method, that allows selective etching of mandrel layer 39 with respect to the hard mask layer 40. The hard mask layer 40 may then be photolithographically patterned and etched using standard photolithographic methods to form a hard mask exposing the mandrel layer 39 in areas where it is to be removed. The mandrel layer 39 may then be removed from unmasked areas using an anisotropic etch, such as an RIE process, to form mandrels 35-38. Each of the mandrels 35-38 projects vertically from the top surface 11 to the hard mask layer 40.

Figure 2A:
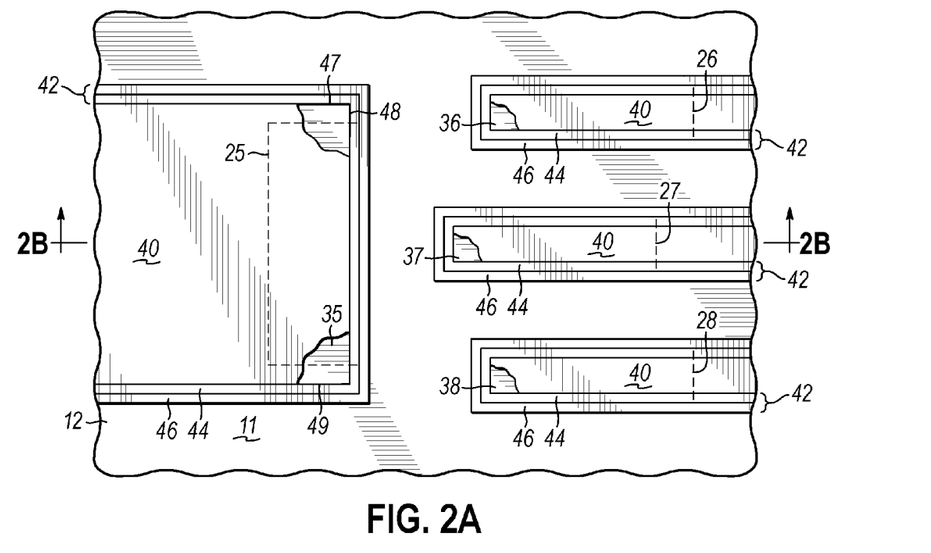
FIGS. 2A and 2B are views similar to FIGS. 1A and 1B, respectively, at a subsequent fabrication stage of the processing method.
Figure 2B:
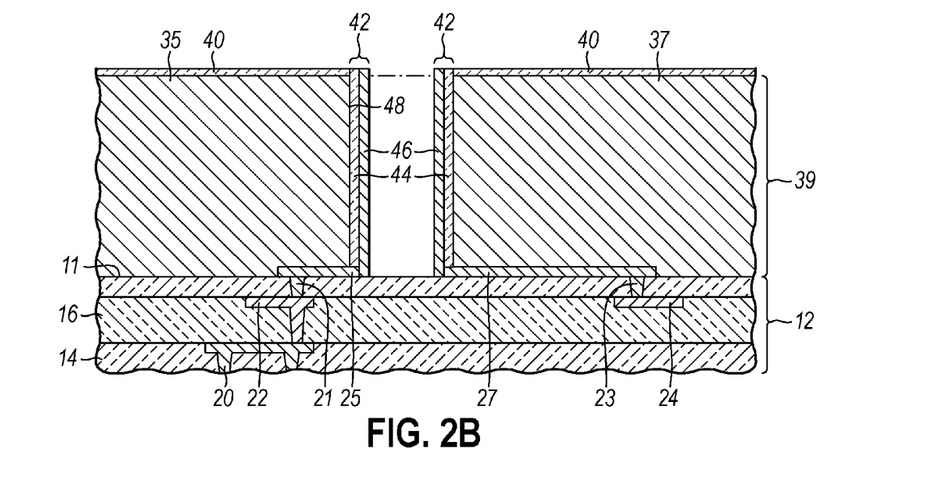

With reference to FIGS. 2A and 2B in which like reference numerals refer to like features in FIGS. 1A and 1B and at a subsequent fabrication stage, an electrode surface layer 42 is formed on the vertical sidewalls of the mandrels 35-38. The electrode surface layer 42 includes a layer stack comprising an electrode dielectric layer 44 and an electrode conductive layer 46. The electrode dielectric layer 44 and electrode conductive layer 46 clad the vertical sidewalls of mandrels 35-38 with the electrode dielectric layer 44 disposed between the electrode conductive layer 46 and the material of the mandrels 35-38.

The electrode dielectric layer 44 is formed initially on the vertical sidewalls of the mandrels 35-38. The electrode dielectric layer 44 is an insulative material (i.e., electrical insulator) that may be comprised of a dielectric material such as $SiO_2$, $Si_3N_4$, or $SiO_xN_y$, and may be blanket deposited using a CVD method so that it has a thickness in the range of 50 to 500 nm, or possibly 100 nm. The electrode dielectric layer 44 may then be anisotropically etched using RIE to remove the horizontal portions, leaving the vertical sections of the electrode dielectric layer 44 in place.

The electrode conductive layer 46 is formed on the vertical sidewalls of the mandrels 35-38 subsequent to electrode dielectric layer 44 and is electrically coupled and physically coupled to the surface contacts 25-28. The electrode conductive layer 46 may be formed by depositing a blanket metal layer with a thickness in the range of 50 to 500 nm, or possibly 100 nm. An optional liner layer (not shown), which is comprised of titanium (Ti), titanium nitride (TiN), or another suitable conductor with material properties appropriate to operate as a diffusion barrier and an adhesion promoter, may be formed on the sidewalls of the mandrels 35-38 before the blanket metal layer is deposited. The blanket metal layer used to form the electrode conductive layer 46 may be comprised of platinum (Pt), gold (Au), Al, Cu, alloys (e.g., AlCu) of primary metals, or other similar metals. The blanket metallic layer may then be anisotropically etched using RIE to remove the horizontal sections, leaving the vertical sections of the electrode conductive layer 46 in place, and electrically isolating the sections of electrode conductive layer 46 remaining on the vertical sidewalls of the individual mandrels 35-38 from each other.

Mandrel 35 has a larger footprint on the top surface 11 of supporting layer 12 than the other mandrels 36-38. The electrode surface layer 42 is disposed on the sidewalls 47, 48, 49 with the electrode dielectric layer 44 between the electrode conductive layer 46 and the material of the mandrel 35.

Figure 3A:
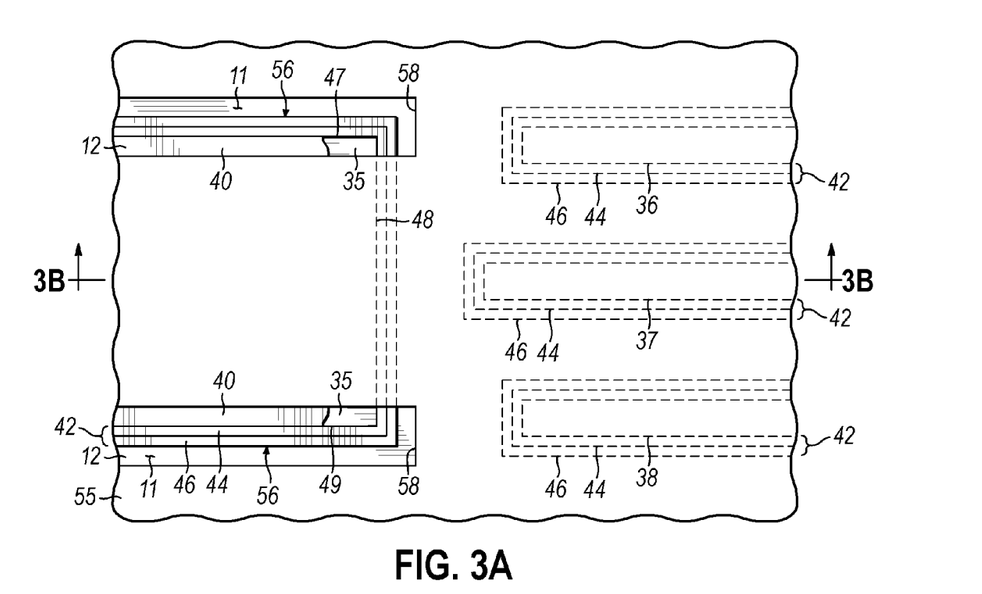
FIGS. 3A and 3B are views similar to FIGS. 2A and 2B, respectively, at a subsequent fabrication stage of the processing method.
Figure 3B:
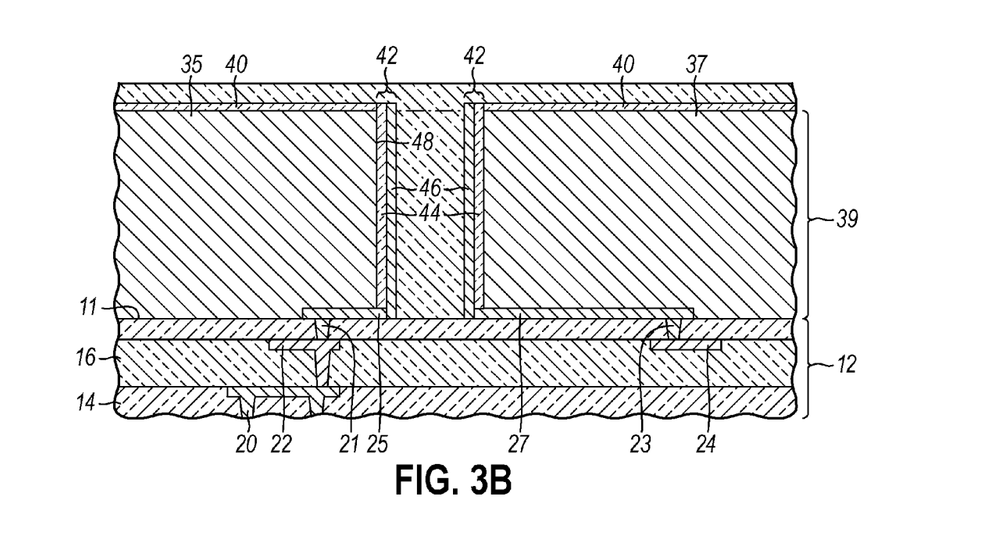

With reference to FIGS. 3A and 3B in which like reference numerals refer to like features in FIGS. 2A and 2B and at a subsequent fabrication stage, end sections 56 of the electrode surface layer 42 are removed from the sidewalls 47, 49 of mandrel 35. Specifically, a trim mask 55 is formed by applying a resist layer and photolithographically patterning the resist layer, masking the electrode surface layer 42 where deflection electrode 53 (FIGS. 4A, 4B) is to be formed. Windows 58 in the trim mask 55 reveal and expose the end sections 56 of the electrode surface layer 42 on mandrel 35. The end sections 56 may then be etched away using a standard etching process, such as RIE, leaving behind an intact section of electrode surface layer 42 on the sidewall 48 of mandrel 35. The trim mask 55 is subsequently stripped with a chemical or plasma stripping process.

Figure 4A:
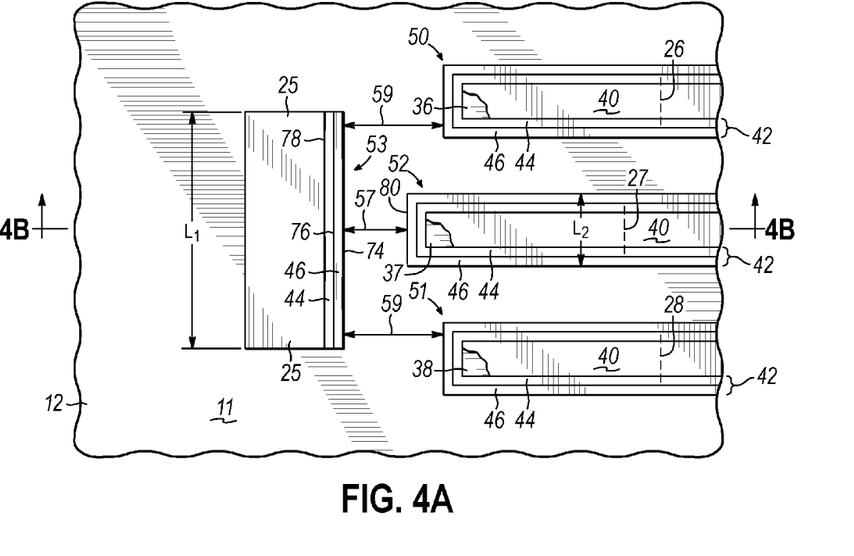
FIGS. 4A and 4B are views similar to FIGS. 3A and 3B, respectively, at a subsequent fabrication stage of the processing method.
Figure 4B:
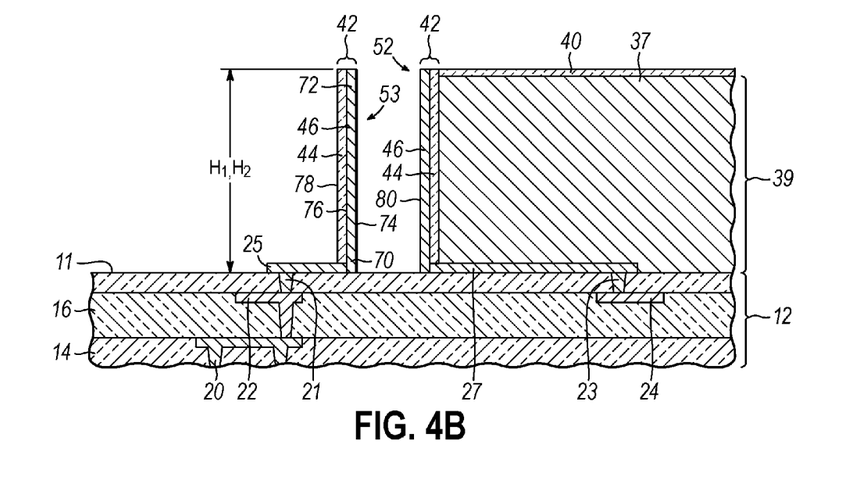

With reference to FIGS. 4A and 4B in which like reference numerals refer to like features in FIGS. 2A, 2B, 3A, and 3B, and at a fabrication stage subsequent to FIGS. 3A and 3B, a deflection electrode 53 of the MEMS switch 10 is completed by removing the mandrel 35 and overlying portion of the hard mask layer 40. To that end, the hard mask layer 40 is removed from mandrel 35 using a photolithographically patterned mask that protects sections of the hard mask layer 40 to be retained on mandrels 36-38. An RIE process is used to expose the top of mandrel 35. Mandrel 35 is then removed using a selective etch wet or dry etch, leaving a vertical section of electrode surface layer 42 that is vertical and freestanding relative to the surface 11 of the supporting layer 12. The removal of the mandrel 35 imparts flexibility to the deflection electrode 53 such that the deflection electrode 53 defines a conductive cantilevered arm that can deflect laterally when subject to an externally applied force. The deflection electrode 53 is defined by the respective portion of electrode conductive layer 46, which is mechanically supported by the electrode dielectric layer 44.

The MEMS switch 10 further includes drive electrodes 50, 51 and a stationary electrode 52 flanked by the drive electrodes 50, 51. The drive electrodes 50, 51 are defined by the respective portions of electrode conductive layer 46 that are mechanically supported by the mandrels 36, 38 and the electrode dielectric layer 44 on the mandrels 36, 38. Similarly, the stationary electrode 52 is defined by a respective portion of electrode conductive layer 46 that is mechanically supported by the mandrel 37 and the electrode dielectric layer 44 on the mandrel 37. The stationary electrode 52 and the deflection electrode 53 have a confronting spatial relationship. The electrode conductive layer 46 of the drive electrodes 50, 51 and deflection electrode 53 projects in a vertical direction from the top surface 11 of the supporting layer 12.

The electrodes 50-53 are positioned laterally relative to each other on the top surface 11 of the supporting layer 12 so that a contact gap 57 is formed between the stationary electrode 52 and deflection electrode 53; and an actuation gap 59 is formed between the deflection electrode 53 and the drive electrodes 50, 51. The contact gap 57 may be range from 0.5 nm to 500 nm in width, or may be 200 nm in a representative embodiment. The actuation gap 59 may be slightly larger than the contact gap 57, so that the stationary electrode 52 is positioned to stop the lateral displacement of the deflection electrode 53 before electrode 53 contacts the drive electrodes 50, 51. This impediment to the displacement posed by the stationary electrode 52 blocks the deflection electrode 53 from contacting and shorting to the drive electrodes 50, 51. The height of the electrodes 50-53 may be 2 µm, but it will be understood by persons having ordinary skill in the art of MEMS switch design that the optimum electrode dimensions of height, gap, layer thicknesses, and actuation voltage may be interdependent on each other.

The conductive cantilevered arm defined by the electrode conductive layer 46 of deflection electrode 53 has a lower portion 70 that is fixed and in physical and electrical contact with contact 25. The conductive cantilevered arm defined by the electrode conductive layer 46 of deflection electrode 53 has an upper portion 72 that is free to move toward the stationary electrode 52 under the externally applied electrostatic force. The layers 44, 46 have a flexibility that permits the deflection to close the switch under the externally applied electrostatic force and to open the switch when the externally applied electrostatic force is removed.

The electrode conductive layer 46 of the deflection electrode 53 has a surface 74 and is coextensive with the electrode dielectric layer 44 of the deflection electrode 53 along an areal interface 76 defined in two dimensions by a contact plane encircled by an outer perimeter. The dimensions of the surface 74 are given by a height, $H_1$, and a length, $L_1$, which can be used to determine a surface area. The electrode dielectric layer 44 of the deflection electrode 53 includes a surface 78 that is separated from surface 74 by the thickness of the layers 44, 46 and is nominally of the same dimensions (e.g., height, $H_1$, and length, $L_1$) as surface 74.

The electrode conductive layer 46 of the stationary electrode 52 has a surface 80 and is coextensive with the electrode dielectric layer 44 of the stationary electrode 52 along an areal interface defined in two dimensions by a contact plane encircled by an outer perimeter. The dimensions of the surface 80 are given by a height, $H_2$, that is approximately equal to the height, $H_1$, and a length, $L_2$, that is narrower than the length, $L_1$. As a consequence, the surface area of surface 80 of stationary electrode 52, which faces the surface 74 of deflection electrode 53 across the contact gap 57, is smaller than the surface area of surface 74. The electrode dielectric layer 44 of the stationary electrode 52 has a directly contacting relationship with the mandrel 37. The stationary electrode 52, which includes the same electrode dielectric layer 44 and electrode conductive layer 46 as the deflection electrode 53, is fixed and stationary because of the presence of the mandrel 37 which lends mechanical support to the layers 44, 46 and stiffness to the composite structure. The drive electrodes 50, 51 have a similar height and length to the stationary electrode 52, although the dimensions of the drive electrodes 50, 51 are not so limited.

The electrode conductive layer 46 of the stationary electrode 52, the electrode conductive layer 46 of the deflection electrode 53, and the electrode conductive layer 46 of the drive electrodes 50, 51, all have a vertical orientation. In other words, the longer dimensions (length and height) of the electrode conductive layer 46 are in a plane that is transverse, and preferably normal, to the top surface 11 of supporting layer 12. The smallest dimension, which is the layer thickness of electrode conductive layer 46, is contained in a plane parallel to the top surface 11. This is a distinction in comparison with conventional horizontally or laterally oriented MEMS switches in which the plane containing the layer thickness is normal to the substrate top surface and the larger dimensions are in a plane parallel to the substrate top surface.

In operation, a bias voltage is applied to the drive electrodes 50, 51, which develops a potential difference between the drive electrodes 50, 51 and the deflection electrode 53. The potential difference causes an attractive electrostatic force to develop between the electrodes 50, 51, 53, which in turn causes the deflection electrode 53 to bend with a cantilevered motion towards the stationary electrode 52. The positioning of the drive electrodes 50, 51 relative to the deflection electrode 53 promotes the existence of a symmetrical attractive electrostatic force.

To insure reliable closure of MEMS switch 10 during actuation, the bias voltage applied to the drive electrodes 50, 51 will typically exceed the pull-in voltage, and is commonly referred to as the actuation voltage for the MEMS switch 10. If a bias voltage exceeding a pull-in voltage for the MEMS switch 10 is applied to the drive electrodes, the deflection electrode 53 may deflect by a distance sufficient to physically contact the stationary electrode 52, forming an electrical contact between the two electrodes and thereby causing the MEMS switch 10 to enter into a closed state. When the bias voltage is removed from the drive electrodes 50, 51, the elastic properties of the deflection electrode 53 cause electrode 53 to revert or return to an equilibrium position, opening up the contact gap 57 and causing the MEMS switch 10 to enter an open state. The MEMS switch 10 may be employed to provide mechanical switchable contact between the deflection electrode 53 and the stationary electrode 52 through an electrical signal on the drive electrodes 50, 51.

The pull-in voltage necessary as a bias potential to cause MEMS switch 10 to enter a closed state may be in the range of 1 volt to 50 volts, or possibly 3 volts to 5 volts. For example, the drive electrodes 50, 51 may be grounded and a positive voltage in one of these ranges may be applied to the deflection electrode 53, or the application of ground potential and positive voltage may be reversed.

Figure 5A:
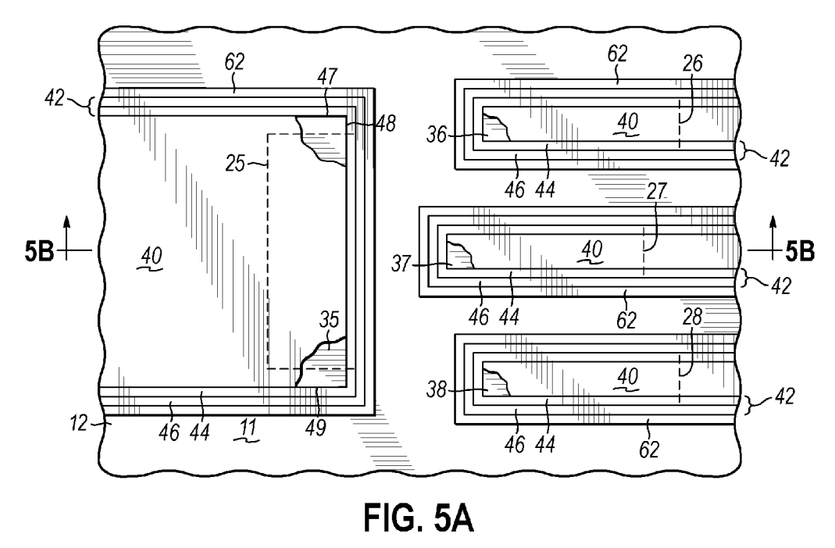
FIG. 5A is a diagrammatic top view of a portion of a substrate at an initial fabrication stage of a processing method in accordance with an alternative embodiment of the invention.
Figure 5B:
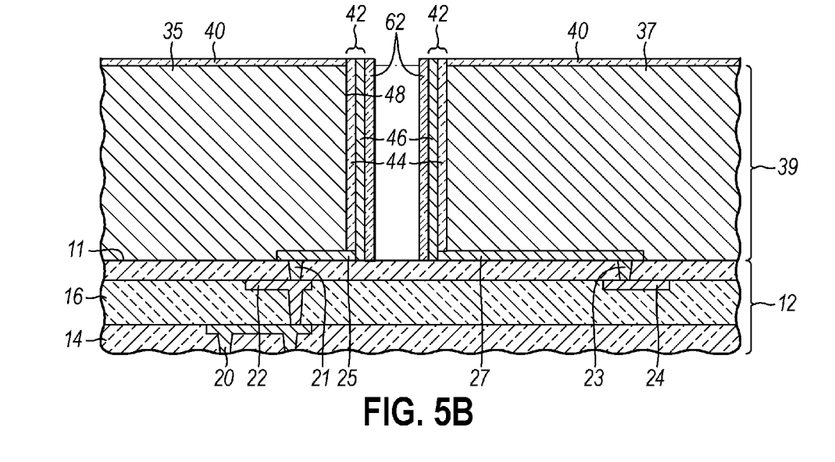
FIG. 5B is a cross-sectional view taken generally along line 5B-5B of FIG. 1A.

With reference to FIGS. 5A, 5B in which like reference numerals refer to like features in FIGS. 2A, 2B and in accordance with an alternate embodiment of the invention, a passivation layer 62 may applied to the electrodes 50-53 as an additional layer to the layer stack forming electrode surface layer 42. Representative materials for the passivation layer 62 include, but are not limited to, $SiO_2$, $Si_3N_4$, or $SiO_xN_y$. A blanket layer of one or more of these materials may be deposited using a CVD method and an anisotropic etch process (e.g., RIE) employed to remove the horizontal portions, leaving the vertical sections of the passivation layer 62 in place. The electrode conductive layer 46 is disposed between the electrode dielectric layer 44 and the passivation layer 62. The material of the passivation layer 62 has a different composition than the material constituting the electrode dielectric layer 44. For example, the passivation layer 62 may be comprised of $SiO_2$ and the electrode dielectric layer 44 may be comprised of $Si_3N_4$.

Figure 6A:
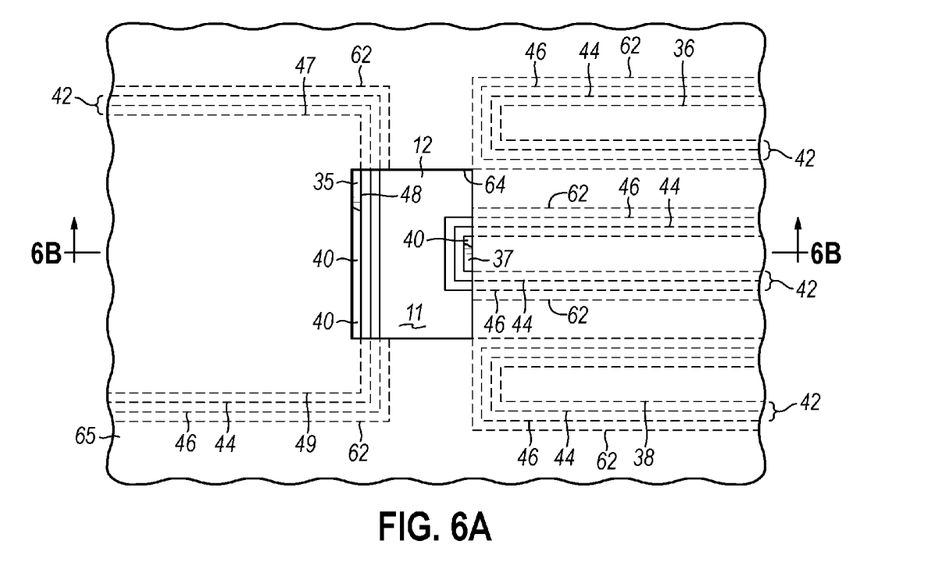
FIGS. 6A and 6B are views similar to FIGS. 5A and 5B, respectively, at a subsequent fabrication stage of the processing method.
Figure 6B:
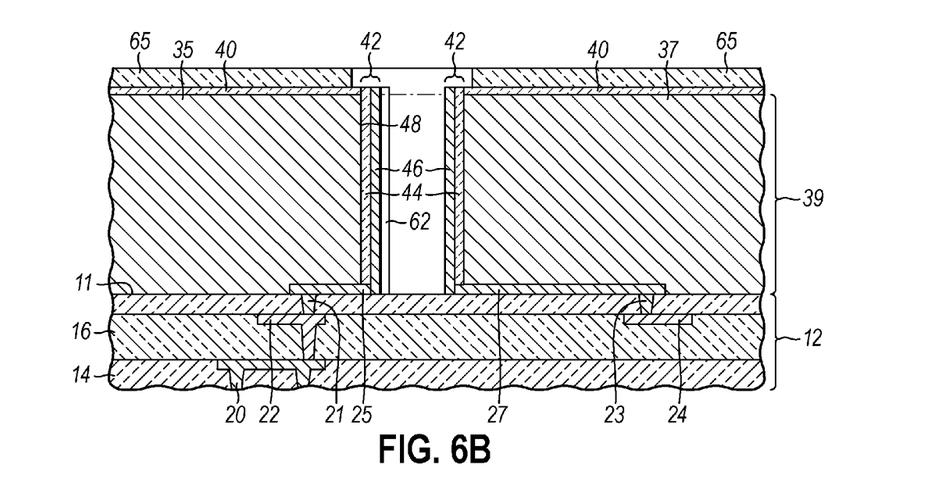

With reference to FIGS. 6A, 6B in which like reference numerals refer to like features in FIGS. 5A, 5B and at a subsequent fabrication step, a trim mask 65 includes a window 64 exposing passivation layer 62 in the areas where the stationary electrode 52 and deflection electrode 53 make contact. The trim mask 65 is formed by applying a resist layer and photolithographically patterning the resist layer. The passivation layer 62 may then be etched away from the contact areas of the stationary electrode 52 and deflection electrode 53 using a standard etching process, such as RIE. Because of the presence of the trim mask 65, the passivation layer 62 remains intact over the drive electrodes 50, 51 and corresponding areas of the deflection electrode 53. Note that a variable capacitor can also be made with this structure, by omitting the trim mask 65 and the associated etching steps.

Formation of the MEMS switch 10 is then completed by removing end portions 56 of the electrode conductive layer 46 on mandrel 35 and by removing mandrel 35 using photolithographic and etching techniques substantially the same as those discussed in connection with FIGS. 3A,B-4A,B. Operation of the MEMS switch 10, which now has passivated versions of the electrodes 50, 51, 53, is essentially the same as in FIG. 4, except that when the deflection electrode 53 and stationary electrode 52 are in contact—i.e. the MEMS switch is in a closed state—the conductive layers 46 of the electrodes 50, 51, 53 are separated by passivation layers 62, so that the switch forms a capacitive contact useful for switching RF and other high frequency signals.

The passivation layer 62 on the deflection electrodes 53 and the drive electrodes 50, 51 prevents the respective electrode conductive layers 46 from making direct physical contact during actuation. The presence of the passivation layer 62 may reduce the likelihood of the deflection electrode 53 becoming physically attached to the drive electrodes 50, 51 during actuation. The temporary attachment may be significant enough to prevent the deflection electrode 53 from returning to its vertical position when the actuation voltage is removed from the drive electrodes 50, 51, causing MEMS switch 10 to remain in a closed state, or may merely introduce a time delay.

Because MEMS switches have sensitive moving parts, they may require protection from external elements to ensure continued proper function. To provide protection, the MEMS switch 10 may be sealed in a protective cavity to keep out foreign matter, and to prevent corrosion or infiltration of moisture into the MEMS switch 10.

Figure 7:
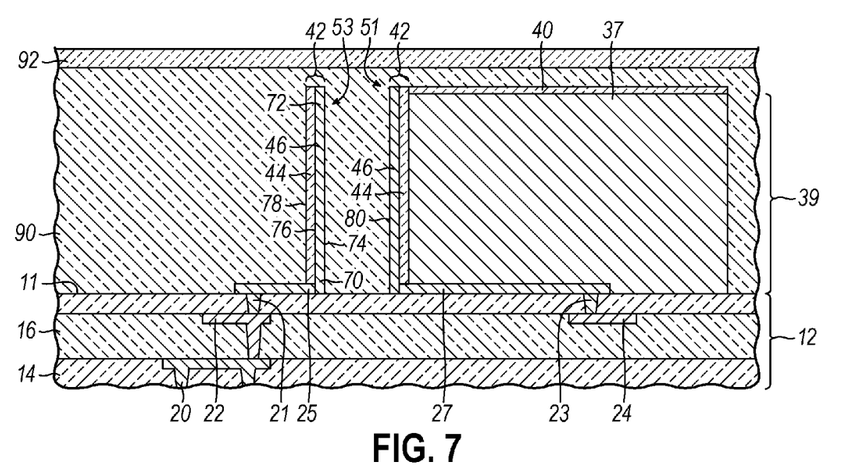
FIGS. 7-9 are diagrammatic cross-sectional views illustrating formation of a cavity that provides environmental protection to the MEMS switch.

Referring now to FIG. 7 in which like reference numerals refer to like features in FIG. 4B and at a subsequent fabrication stage for a process to package the MEMS switch 10, the switch 10 is initially embedded in a sacrificial layer 90 and a hardmask layer 92 is applied on the sacrificial layer 90. The sacrificial layer 90 may be formed of a dielectric material such as $SiO_2$ deposited using a CVD process, and planarized using a conventional process such as Chemical Mechanical Polishing (CMP). Alternatively, sacrificial layer 90 may be formed from a polymer such as a polyimide, or other suitable material, applied using a spin-on process. The thickness of sacrificial layer 90 is contingent upon the required spacing between the top of the electrodes 50-53 comprising MEMS switch 10 and the top of the cavity to be formed. For example, the sacrificial layer 90 may have a thickness in the range of 5 μm to 100 μm, thereby providing a sufficient cavity height to allow operation of MEMS switch 10 after the sacrificial layer 90 is removed. The hardmask layer 92 is deposited on top of the sacrificial layer 90 using a conventional CVD method, and may be comprised of any suitable material, such as $Si_3N_4$, that will allow a selective isotropic etch of sacrificial layer 90 with respect to the hardmask material.

Figure 8:
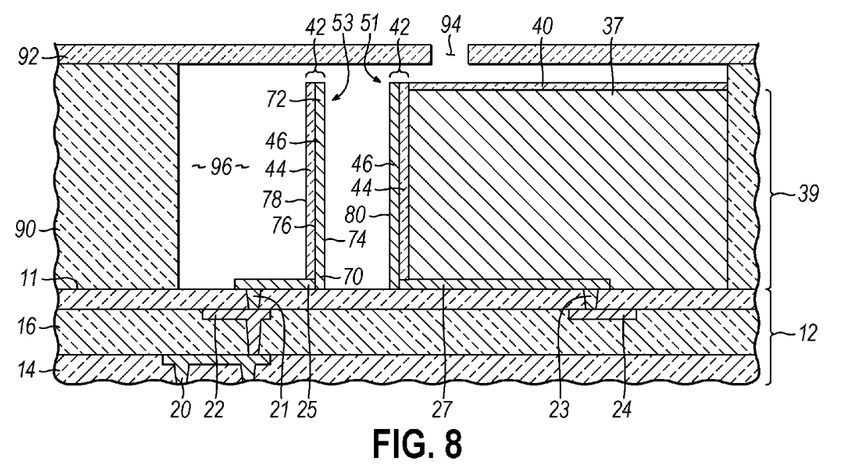

Referring now to FIG. 8 in which like reference numerals refer to like features in FIG. 7 and at a subsequent fabrication stage, a window 94 is formed in the hardmask layer 92 and a cavity 96 is defined in the sacrificial layer 90. The window 94 may be formed by photolithographically patterning the hardmask layer 92 and etching using standard photolithographic methods to form window 94. The sacrificial layer 90 may then be removed from beneath the hardmask layer 92 using an isotropic etchant that removes the material of the sacrificial layer 90 selective to the materials of the MEMS switch 10. The etchant, which gains access to the sacrificial layer 90 through the window 94, undercuts the hardmask layer 92 to form the cavity 96. If the sacrificial layer 90 is formed of $SiO_2$ and other exposed layers are not formed of $SiO_2$, an isotropic etch, such as a wet etch using hydrofluoric acid (HF), may be used to selectively remove the sacrificial layer 90. If the sacrificial layer 90 is formed from polyimide as a representative polymer, an ashing process using an oxygen plasma may be used to selectively remove the sacrificial layer 90 and form the cavity 96. The cavity 96 uncovers the electrodes 50-53 and frees the deflection electrode 53 for cantilevered motion.

Figure 9:
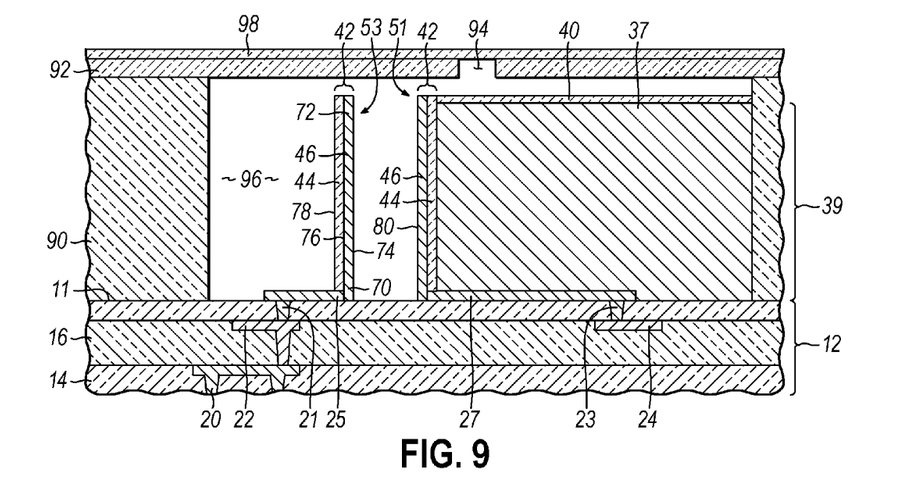

With reference to FIG. 9 in which like reference numerals refer to like features in FIG. 8 and at a subsequent fabrication stage, a cap layer 98 is formed on the hardmask layer 92 following the formation of the cavity 96. The cap layer 98 may be may be formed using conventional deposition techniques, such as CVD, and may be comprised of the same material as hardmask layer 92, or any other material suitable for sealing cavity 96. The cap layer 98 may be comprised of, for example, $SiO_2$ deposited using a CVD process. Cap layer 98 isolates the cavity 96 from external elements by covering the window 94 in hardmask layer 92. Limiting the dimensions of window 94 to the minimum required for effective etching of cavity 96 may result in rapid pinch off occurring during deposition of cap layer 98 as the window 94 is bridged, thus limiting infiltration of the deposited material forming cap layer 98 into the cavity 96. Locating the window away from the deflection electrode 53 and the contact areas of electrodes 50-52 may also prevent the deposited material forming cap layer 98 from accumulating in cavity 96 in places where it might impair the function of MEMS switch 10.

Figure 10:
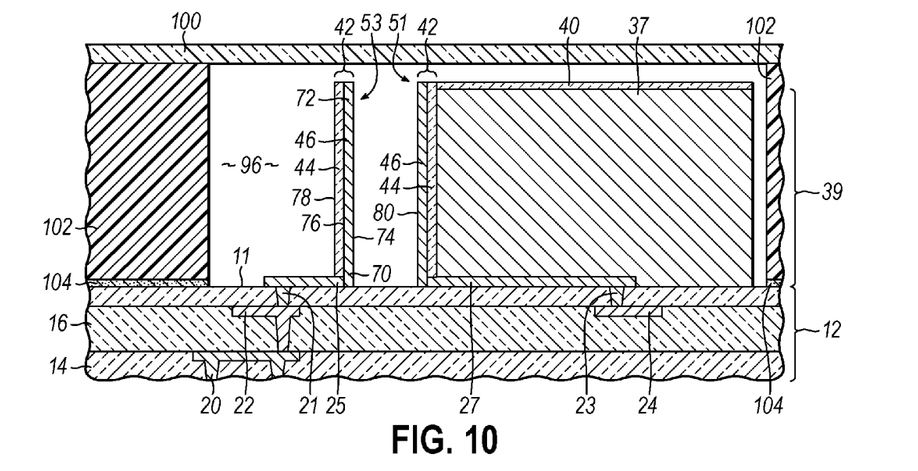
FIG. 10 is a diagrammatic cross-sectional view illustrating an alternative structure for providing environmental protection to the MEMS switch.

Referring now to FIG. 10 in which like reference numerals refer to like features in FIG. 4A and at a subsequent fabrication stage, a plate 100 and support columns 102 may be placed over MEMS switch 10 to form the cavity 96. Plate 100 may be comprised of glass or any other suitable material and may be transparent to allow the plate 100 to be optically aligned with the supporting layer 12. To assist in alignment, fiducials (not shown) may be provided on the supporting layer 12 to allow accurate alignment with associated alignment structures formed on the plate 100. Support columns 102 may be formed of a polymer, such as a polyimide, and may be applied to plate 100 by spin coating or other suitable thin film deposition process. Support columns 102 may then be fabricated on plate 100 using photolithograph patterning techniques, or by imprinting or embossing. The exposed ends of the support columns 102 may be coated with an adhesive 104, and the plate 100 aligned and placed over supporting layer 12. Alternatively, support columns 102 may be formed directly on supporting layer 12 in substantially the same manner as described for forming the support columns on plate 100, and plate 100 adhesively bonded to the support columns 102. Support columns 102 may be configured to form a closed sidewall around MEMS switch 10, so that MEMS switch 10 is isolated from external environmental elements by the substrate cap.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A microelectromechanical (MEMS) switch formed on a supporting layer having a top surface, the MEMS device comprising:
    a stationary electrode including a conductive layer with a vertical orientation relative to the top surface of the supporting layer;
    at least one drive electrode; and
    a deflection electrode including a conductive layer with a vertical orientation relative to the top surface of the supporting layer, and the deflection electrode configured to be electrostatically attracted toward the at least one drive electrode, when the at least one drive electrode is electrically biased, with a cantilevered motion so that the conductive layer of the deflection electrode contacts the conductive layer of the stationary electrode.

2. The MEMS switch of claim 1 wherein the stationary electrode is positioned on the top surface of the supporting layer such that the conductive layer of the stationary electrode and that the conductive layer of the deflection electrode have respective confronting surfaces.

3. The MEMS switch of claim 2 wherein the confronting surface of the conductive layer of the deflection electrode has a larger surface area than the confronting surface of the conductive layer of the stationary electrode.

4. The MEMS switch of claim 2 wherein the at least one drive electrode comprises a first drive electrode and a second drive electrode, the stationary electrode is positioned laterally between the first drive electrode and the second drive electrode, and the conductive layer of the stationary electrode is separated from the conductive layer of the deflection electrode by a first gap smaller than a second gap between the conductive layer of the deflection electrode and the first and second drive electrodes.

5. The MEMS switch of claim 1 wherein the conductive layer of the deflection electrode has a first portion and a second portion spaced vertically from the first portion, the second portion of the conductive layer of the deflection electrode contacts the conductive layer of the stationary electrode during the cantilevered motion, and further comprising:
    a first contact on the top surface of the supporting layer, the first contact mechanically coupled with the first portion of the conductive layer of the deflection electrode so that the first contact and the conductive layer of the deflection electrode are electrically coupled.

6. The MEMS switch of claim 5 further comprising:

a second contact on the top surface of the supporting layer, the second contact mechanically coupled with the conductive layer of the stationary electrode so that the second contact and the conductive layer of the stationary electrode are electrically coupled.

7. The MEMS switch of claim 1 wherein the deflection electrode further includes a dielectric layer comprised of a dielectric material, and the dielectric layer of the deflection electrode is coextensive with the conductive layer of the deflection electrode.

8. The MEMS switch of claim 1 wherein the conductive layer of the deflection electrode and the conductive layer of the stationary electrode are separated by a contact gap bridged when the conductive layer of the deflection electrode contacts the conductive layer of the stationary electrode.

9. The MEMS switch of claim 8 wherein the deflection electrode includes a dielectric layer, and the conductive layer of the deflection electrode is disposed between the dielectric layer of the deflection electrode and the conductive layer of the stationary electrode.

10. The MEMS switch of claim 1 further comprising:

a cap layer; and a sacrificial layer between the cap layer and the supporting layer, the sacrificial layer including a cavity containing the stationary electrode, the at least one drive electrode, and the deflection electrode.

11. The MEMS switch of claim 1 further comprising:

a glass plate; and a plurality of support columns separating the glass plate from the dielectric substrate to define a cavity containing the stationary electrode, the at least one drive electrode, and the deflection member.

12. The MEMS switch of claim 1 wherein the conductive layer of the stationary electrode and the conductive layer of the deflection electrode are aligned parallel to each other when the at least one drive electrode is not electrically biased.

* * * * *